(12) United States Patent
Mahajan et al.

(10) Patent No.: US 8,441,809 B2
(45) Date of Patent: May 14, 2013

(54) MICROELECTRONIC PACKAGE CONTAINING SILICON CONNECTING REGION FOR HIGH DENSITY INTERCONNECTS, AND METHOD OF MANUFACTURING SAME

(75) Inventors: Ravi Mahajan, Chandler, AZ (US); Sandeep Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 13/161,538

(22) Filed: Jun. 16, 2011

(65) Prior Publication Data

US 2011/0241208 A1  Oct. 6, 2011

Related U.S. Application Data

(63) Continuation of application No. 12/059,133, filed on Mar. 31, 2008, now Pat. No. 8,064,224.

(51) Int. Cl.
*H05K 7/02* (2006.01)
*H01L 21/78* (2006.01)
*H01L 21/50* (2006.01)

(52) U.S. Cl.
USPC .................... 361/809; 257/E21.499; 361/762

(58) Field of Classification Search .......... 361/762–764, 361/774, 809
See application file for complete search history.

(56) References Cited

U.S. PATENT DOCUMENTS

| 4,711,804 A | * | 12/1987 | Burgess ........................ 428/210 |
| 5,153,384 A | * | 10/1992 | Iijima et al. .................... 174/257 |
| 5,646,828 A | | 7/1997 | Degani et al. |
| 5,998,244 A | * | 12/1999 | Wolstenholme et al. ...... 438/128 |
| 6,014,317 A | * | 1/2000 | Sylvester ....................... 361/760 |
| 6,071,779 A | * | 6/2000 | Mehrad et al. ................. 438/262 |
| 6,317,331 B1 | * | 11/2001 | Kamath et al. ................. 361/760 |
| 7,742,307 B2 | * | 6/2010 | Ellsworth et al. ............. 361/720 |
| 7,876,577 B2 | * | 1/2011 | Weber et al. .................. 361/807 |
| 2006/0008975 A1 | * | 1/2006 | Gonzalez et al. ............. 438/237 |
| 2007/0048888 A1 | * | 3/2007 | Christenson .................... 438/48 |

FOREIGN PATENT DOCUMENTS

DE 60214894 T2 4/2007
JP 08-124967 A 5/1996

OTHER PUBLICATIONS

Office action received for Chinese Patent Application No. 200980107171.1, mailed on Dec. 7, 2011, 3 pages of Chinese office action and 1 page of English translation.
Office action received for Korean Patent Application No. 10-2010-7021305, mailed on Jan. 20, 2012, 3 pages of Korean office action and 2 pages of English translation.
Office action received for German Patent Application No. 112009000351.6, mailed on Aug. 2, 2011, 6 pages of German office action.

(Continued)

*Primary Examiner* — Gregory Thompson
(74) *Attorney, Agent, or Firm* — Kenneth A. Nelson

(57) ABSTRACT

A microelectronic package comprises a substrate (110), a silicon patch (120) embedded in the substrate, a first interconnect structure (131) at a first location of the silicon patch and a second interconnect structure (132) at a second location of the silicon patch, and an electrically conductive line (150) in the silicon patch connecting the first interconnect structure and the second interconnect structure to each other.

7 Claims, 3 Drawing Sheets

OTHER PUBLICATIONS

Examination Report received for Great Britain Patent Application No. GB1015981.2, mailed on Mar. 20, 2012, 1 page of examination report.

Office Action Received for Japanese Patent Application No. 2010-550928, mailed on Oct. 16, 2012, 2 Pages of Japanese Office Action and 2 Pages of English Translation.

* cited by examiner

US 8,441,809 B2

MICROELECTRONIC PACKAGE CONTAINING SILICON CONNECTING REGION FOR HIGH DENSITY INTERCONNECTS, AND METHOD OF MANUFACTURING SAME

CLAIM OF PRIORITY

This application is a continuation of U.S. patent application Ser. No. 12/059,133, now U.S. Pat. No. 8,064,224, which was filed on Mar. 31, 2008.

FIELD OF THE INVENTION

The disclosed embodiments of the invention relate generally to microelectronic packages, and relate more particularly to electrical connections within microelectronic packages.

BACKGROUND OF THE INVENTION

In order to enhance performance, central processing unit (CPU) products are increasingly integrating multiple die within the CPU package in a side-by-side or other multi-chip-module (MCM) format. This development, along with other factors such as the long-standing trend toward increasing miniaturization, is leading the microelectronics industry toward a situation in which it may no longer be possible to fit a sufficient number of die connections (measured by input/output (I/O) per millimeter (mm) of die edge per layer) into the available space. An insufficient number of die connections would limit the bandwidth capability for the affected die interface, and thus logic-logic and/or logic-memory communications would suffer. The current approach of evolutionary increases in I/O density through scaling of the controlled collapse chip connect (C4) interconnect and the substrate Line/Spaces could well be inadequate in the future for at least some applications.

BRIEF DESCRIPTION OF THE DRAWINGS

The disclosed embodiments will be better understood from a reading of the following detailed description, taken in conjunction with the accompanying figures in the drawings in which.

Figure 1:
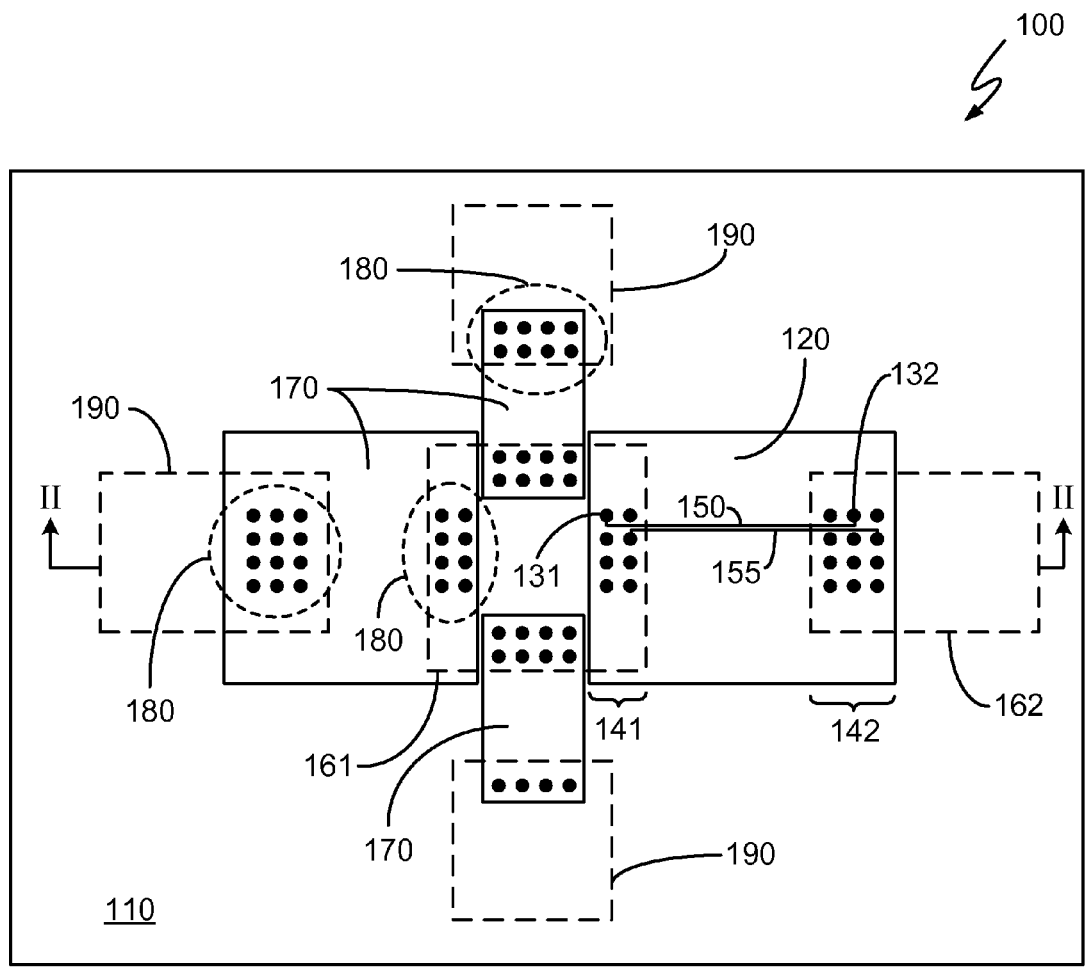
FIG. 1 is a plan view of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic package comprises a substrate, a silicon patch embedded in the substrate, a first interconnect structure at a first location of the silicon patch and a second interconnect structure at a second location of the silicon patch, and an electrically conductive line in the silicon patch connecting the first interconnect structure and the second interconnect structure to each other.

Embodiments of the invention may provide significantly increased I/O density and therefore significantly increased bandwidth for communication between dies in a microelectronic package. Speaking generally, embodiments of the invention embed pieces of silicon with high density solder bumps and fine lines, with the latter being made using traditional silicon processes. Assembly with the logic or memory die can use traditional assembly processes as known in the art.

As an example, a minimum interconnect pitch of 150 micrometers (hereinafter, "microns" or "μm") with a Line/Space of 10 μm yields an I/O density of approximately 28 I/O per mm per layer. If these values were shrunk to, for example, an 80 μm pitch and a 2 μm Line/Space the I/O density would increase to approximately 100 I/O per mm per layer. In addition to the greatly increased communication bandwidth such an I/O density would provide, embodiments of the invention may also enable improved assembly processes due (at least in part) to the maturity of silicon process technology. Accordingly, embodiments of the invention provide a new way to make high density interconnects between logic-logic die and/or logic-memory die, thus enabling the high bandwidth interconnections needed to meet future demand.

Furthermore, embodiments of the invention may lead to improvements in overall mechanical reliability (e.g., reductions in bump cracking, ILD fails, and the like) because of the reduced CTE mismatch at the bumps located at a greatest distance from the neutral point (DNP) and elsewhere. As an example, and as further discussed below, embedding silicon in a package substrate may, depending on the geometry of the embedded silicon, reduce the effective coefficient of thermal expansion (CTE) of the substrate to a value that more closely matches the CTE of the associated dies. The reduction in the effective substrate CTE has several potential mechanical benefits in addition to those mentioned above, including reduction in stress transfer to the fragile low-k inter-layer dielectric (ILD) layers in the silicon backend interconnect layers, reduction in post assembly warpage, and reduction of thermal interface material (TIM) stresses during reliability tests.

Referring now to the drawings, FIG. 1 is a plan view of a microelectronic package 100 according to an embodiment of the invention. As illustrated in FIG. 1, microelectronic package 100 comprises a substrate 110 and a silicon patch 120 embedded in substrate 110. Microelectronic package 100 further comprises an interconnect structure 131 at a location 141 in silicon patch 120, an interconnect structure 132 at a location 142 in silicon patch 120, and an electrically conductive line 150 in silicon patch 120 connecting interconnect structure 131 and interconnect structure 132 to each other. In the illustrated embodiment, interconnect structure 131 is one of a plurality of interconnect structures located at location 141 and interconnect structure 132 is one of a plurality of interconnect structures located at location 142. As an example, these pluralities of interconnect structures can be designed to maximize the number of interconnections they make possible.

As an example, substrate 110 can be a traditional organic substrate as known in the art. As another example, interconnect structure 131 and/or interconnect structure 132 can comprise a copper pillar or the like. In one embodiment, the copper pillar comprises an interlocking feature, as will be depicted in a subsequent figure and further discussed below.

As another example, a width of electrically conductive line 150 (as well as the widths of all similar electrically conductive lines described herein) may be no greater than approximately 0.2 micrometers (hereinafter "microns"), while the spacing between (i.e., the pitch of) at least one pair of adjacent interconnect structures is no greater than 80 microns. It will be readily apparent to a person of ordinary skill in the art that these pitches and line widths are significantly smaller than what is possible with currently-available technology for copper lines in polymer layers. An advantage of embedding silicon in substrates according to embodiments of the invention is that silicon processes have already advanced to the degree that such small pitches and line widths are within reach of current technology.

Microelectronic package 100 still further comprises a die 161 and a die 162 over substrate 110. In FIG. 1 the outlines of die 161 and die 162 are shown in dashed lines indicating that they are located over silicon patch 120 and substrate 110. In other words, FIG. 1 depicts die 161 and die 162 as if they were transparent (except for their outlines) so that the underlying detail may be seen. In general terms, location 141 is the area of silicon patch 120 that is under die 161 and location 142 is the area of silicon patch 120 that is under die 162.

FIG. 1 also depicts an electrically conductive line 155 connecting an unlabeled pair of interconnect structures (one from location 141 and one from location 142), and further depicts additional silicon patches 170, additional interconnect structures 180, and additional dies 190. Note that only some of additional interconnect structures 180 are indicated with a reference numeral in FIG. 1; non-labeled interconnect structures 180 in the figure should be easily identifiable based on the similarity of their appearance to those interconnect structures 180 that are labeled. As an example, each one of silicon patches 170 can be similar to silicon patch 120. In one embodiment, silicon patches 170 do not overlap or touch each other, in order to avoid potential problems with flexibility that could otherwise result. As another example, each one of interconnect structures 180 can be similar to interconnect structure 131 and/or interconnect structure 132. As yet another example, each one of dies 190 can be similar to die 161 and/or die 162.

In practice, large numbers of electrically conductive lines such as electrically conductive lines 150 and 155 will be densely packed within the embedded silicon patches, enabling very low pitch as well as very high density interconnects. The RC behavior of these interconnects can be managed using traditional silicon manufacturing processes.

Figure 2:
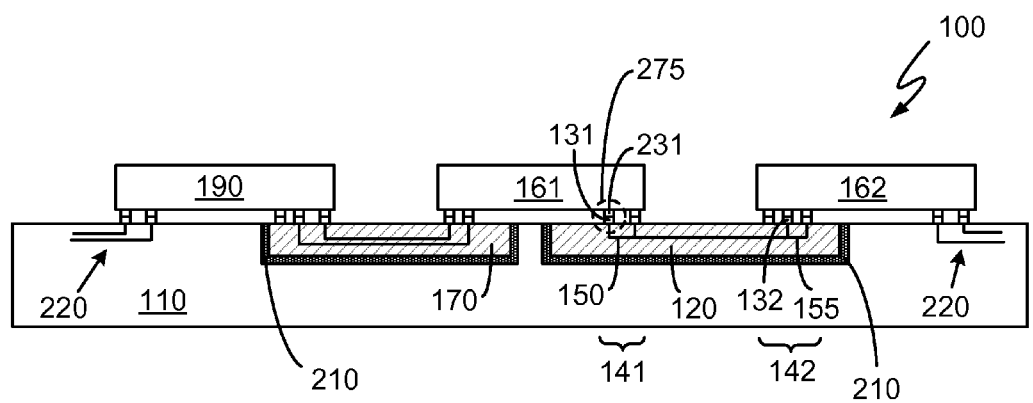
FIG. 2 is a cross-sectional view of the microelectronic package of FIG. 1 according to an embodiment of the invention.

FIG. 2 is a cross-sectional view of microelectronic package 100 taken along a line II-II of FIG. 1. Visible in FIG. 2 are substrate 110, silicon patch 120, interconnect structures 131 and 132 at respective locations 141 and 142, electrically conductive lines 150 and 155, dies 161 and 162, one of additional silicon patches 170, and one of additional dies 190. For clarity in FIG. 2, silicon patches 120 and 170 are shown with cross hatching marks. It should be noted that the cross hatching marks are not shown in those silicon patches as they are depicted in FIG. 1.

As illustrated in FIG. 2, electrically conductive lines 150 and 155 extend into silicon patch 120 to the same depth. On the other hand, silicon patch 170 contains a pair of (unlabeled) electrically conductive lines that extend to different depths within silicon patch 170. Either or both of these arrangements, or some other arrangement, may be used for electrically conductive lines in silicon patches according to various embodiments of the invention. In one embodiment, the depth of the silicon patches themselves within substrate 110 may be between approximately 70 and 100 microns.

As further illustrated in FIG. 2, substrate 110 contains a well (or wells) having therein a buffer material 210. Silicon patch 120 (as well as silicon patch 170) is embedded in the well adjacent to buffer material 210. As an example, buffer material 210 can be a silicone-based material or the like providing a compliant cushion (with connectivity) so as to provide a stress buffer between the silicon of silicon patches 120 and 170 and the organic material of substrate 110. Whatever its composition, buffer material 210 serves to mitigate the level of CTE stress experienced both by the silicon patches and by the substrate due to the CTE mismatch between the two materials.

Staying with the subject of CTE mismatch, it may be useful to mention here that the presence of silicon patches 120 and 170 in substrate 110 will reduce the effective CTE of substrate 110 from a value of approximately 17 parts per million per degree Kelvin (ppm/° K) (without the silicon patches) to a value with the silicon patches of approximately 10-12 ppm/° K. (The actual CTE value of the substrate with embedded silicon patches depends on the geometry of the embedded silicon). Several benefits of this reduction in the effective substrate CTE have been mentioned above.

In the illustrated embodiment, microelectronic package 100 further comprises electrically conductive lines 220 in substrate 110. (For purposes of simplicity, these are depicted as terminating in substrate 110 without being connected to anything but would in reality, of course, continue on and complete their intended electrical connection.) Electrically conductive lines 220 may be in the depicted locations and/or in other locations as needed according to design requirements for microelectronic package 100. As an example, electrically conductive lines 220 may be power lines and, as such, may be fewer in number and/or, because of the higher current they must carry, larger in size than electrically conductive lines 150 and 155 (which, as mentioned above, are designed for high-bandwidth, high-density bus interconnections between package dies). It should be understood that some or all of electrically conductive lines 220 could instead be used for other purposes, and further understood that electrically conductive lines 220 could be located outside of the silicon patches, as depicted, or within the silicon patches.

A feature 275 in FIG. 2 comprises interconnect structure 131 and further comprises an electrically conductive structure 231 as well as (in some cases) various other additional structures and/or details as will now be described in connection with FIGS. 3-5, which are cross-sectional views of the indicated portion of microelectronic package 100 according to various embodiments of the invention. These details are not included in FIG. 2 because the smaller scale of that figure does not easily permit their inclusion and also because FIG. 2 is intended to be general enough to encompass many possible configurations of feature 275. Similarly, certain details that are depicted in FIG. 2 may be omitted from FIGS. 3-5. As an example, electrically conductive structure 231 can be similar to electrically conductive interconnect structure 131.

Figure 3:
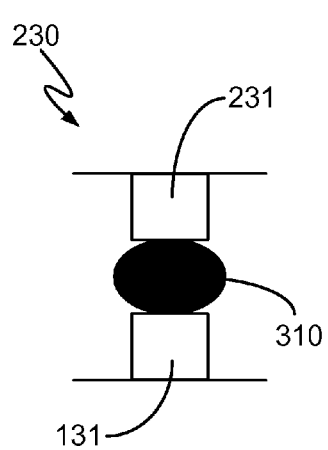
FIGS. 3-5 are cross-sectional views of a portion of the microelectronic package of FIGS. 1 and 2 according to various embodiments of the invention.

FIG. 3 illustrates an embodiment in which a solder bump 310 is located between electrically conductive interconnect structure 131 and electrically conductive structure 231. A solder bump between copper pillars (or other interconnect structures) may be formed using known processes, is relatively easy to manufacture, and lends itself to self-alignment, among other possible advantages.

Figure 4:
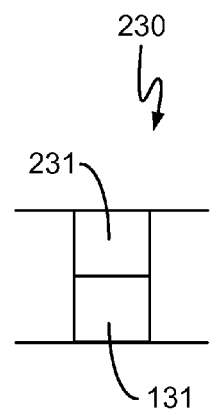

FIG. 4 illustrates an embodiment in which interconnect structure 131 and electrically conductive structure 231 are pressed together in such a way as to facilitate diffusion bonding. As an example, this process may lower the attach temperature and change the resulting state of stress in the joint and the overall structure.

Figure 5:
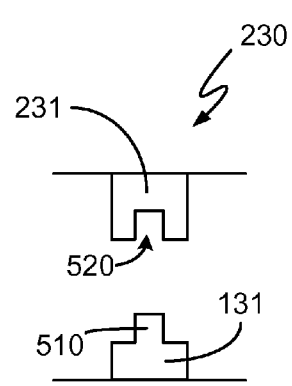

FIG. 5 illustrates an embodiment in which interconnect structure 131 and electrically conductive structure 231 are provided with interlocking features such as those forming the dovetail-like joint shown, in which a protrusion 510 on interconnect structure 131 is designed to fit into an opening 520 in electrically conductive structure 231, thereby interlocking the two interconnect structures together. As an example, this technique may improve the alignment of the two silicon entities being joined. Many other types of interlocking features are also possible, as will be recognized on a person of ordinary skill in the art.

Figure 6:
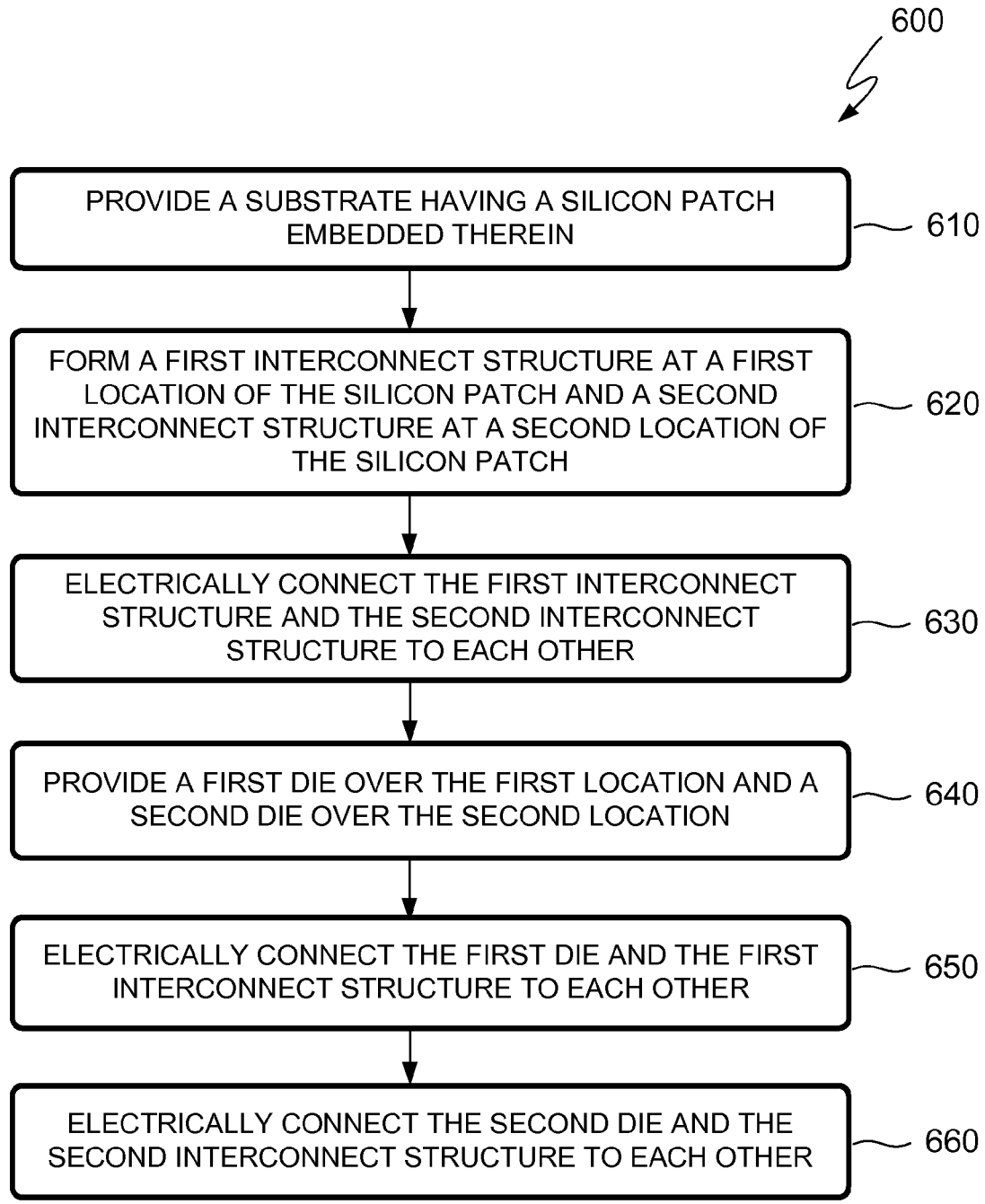
FIG. 6 is a flowchart illustrating a method of manufacturing a microelectronic package according to an embodiment of the invention.

FIG. 6 is a flowchart illustrating a method 600 of manufacturing a microelectronic package according to an embodiment of the invention. A step 610 of method 600 is to provide a substrate having a silicon patch embedded therein. As an example, the substrate can be similar to substrate 110 and the silicon patch can be similar to silicon patch 120, both of which are first shown in FIG. 1.

A step 620 of method 600 is to form a first interconnect structure at a first location of the silicon patch and a second interconnect structure at a second location of the silicon patch. As an example, the first interconnect structure can be similar to interconnect structure 131 and the second interconnect structure can be similar to interconnect structure 132, both of which are first shown in FIG. 1.

A step 630 of method 600 is to electrically connect the first interconnect structure and the second interconnect structure to each other.

A step 640 of method 600 is to provide a first die over the first location and a second die over the second location. As an example, the first die can be similar to die 161 and the second die can be similar to die 162, both of which are first shown in FIG. 1.

A step 650 of method 600 is to electrically connect the first die and the first interconnect structure to each other. In one embodiment, step 650 comprises providing a first electrically conductive structure at the first die and providing a first solder joint between the first electrically conductive structure and the first interconnect structure. As an example, the first electrically conductive structure can be similar to electrically conductive structure 231, first shown in FIG. 2. As another example, the first solder joint can be similar to solder bump 310, first shown in FIG. 3. In another embodiment, step 650 comprises pressing together the first electrically conductive structure and the first interconnect structure in order to form a diffusion bond therebetween.

In a different embodiment, the first interconnect structure has a first interlocking feature and the first electrically conductive structure has a third interlocking feature. As an example, the first interlocking feature can be similar to protrusion 510 and the third interlocking feature can be similar to opening 520, both of which are shown in FIG. 5. In that embodiment, step 650 can comprise interlocking the first interlocking feature and the third interlocking feature.

A step 660 of method 600 is to electrically connect the second die and the second interconnect structure to each other. In one embodiment, step 660 and step 650 can be performed as part of the same step, and can in the same or another embodiment be performed simultaneously. In the same or another embodiment, step 660 comprises providing a second electrically conductive structure at the second die and providing a second solder joint between the second electrically conductive structure and the second interconnect structure. As an example, the second electrically conductive structure can be similar to electrically conductive structure 231, first shown in FIG. 2. As another example, the second solder joint can be similar to solder bump 310, first shown in FIG. 3. In another embodiment, step 660 comprises pressing together the second electrically conductive structure and the second interconnect structure in order to form a diffusion bond therebetween.

In a different embodiment, the second interconnect structure has a second interlocking feature and the second electrically conductive structure has a fourth interlocking feature. As an example, the second interlocking feature can be similar to protrusion 510 and the fourth interlocking feature can be similar to opening 520, both of which are shown in FIG. 5. In that embodiment, step 660 can comprise interlocking the second interlocking feature and the fourth interlocking feature.

It should be understood that the foregoing steps are illustrative of one embodiment of the invention, as mentioned, and may be altered in various ways without exceeding the scope of the invention. As just one example, step 650 and/or step 660 may be performed prior to the performance of step 630.

In other words, the first die and the first interconnect structure and/or the second die and the second interconnect structure may be electrically connected to each other before the first and second interconnect structures are electrically connected to each other.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic packages and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
an organic substrate;
a silicon connecting region embedded in the substrate at a depth not exceeding 100 micrometers;
a first metal terminal at a first location of the silicon connecting region and a second metal terminal at a second location of the silicon connecting region; and
an electrically conductive line in the silicon connecting region connecting the first metal terminal and the second metal terminal to each other.

2. The microelectronic package of claim 1 wherein:
the substrate contains a well having a buffer material therein; and
the silicon connecting region is embedded in the well adjacent to the buffer material.

3. The microelectronic package of claim 1 wherein:
at least one of the first and second metal terminals comprises a copper pillar.

4. The microelectronic package of claim 3 wherein:
the copper pillar comprises an interlocking feature.

5. The microelectronic package of claim 1 wherein:
a width of the electrically conductive line is no greater than approximately 0.2 microns.

6. The microelectronic package of claim 1 further comprising:
a power line in the substrate.

7. The microelectronic package of claim 1 wherein:
the substrate has an effective coefficient of thermal expansion of between approximately 10 ppm/° K and approximately 12 ppm/° K.

* * * * *